(12) United States Patent
Hu et al.

(10) Patent No.: US 10,686,123 B2
(45) Date of Patent: Jun. 16, 2020

(54) MULTILAYERED MAGNETIC FREE LAYER STRUCTURE FOR SPIN-TRANSFER TORQUE (STT) MRAM

(71) Applicant: International Business Machines Corporation, Armonk, NY (US)

(72) Inventors: Guohan Hu, Yorktown Heights, NY (US); Daniel Worledge, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/999,229

(22) Filed: Aug. 16, 2018

(65) Prior Publication Data

US 2020/0058845 A1    Feb. 20, 2020

(51) Int. Cl.
| | |
|---|---|
| *H01L 43/02* | (2006.01) |
| *H01L 43/12* | (2006.01) |
| *G11C 11/16* | (2006.01) |
| *H01L 27/22* | (2006.01) |
| *H01L 43/10* | (2006.01) |

(52) U.S. Cl.
CPC .......... *H01L 43/02* (2013.01); *G11C 11/161* (2013.01); *H01L 27/222* (2013.01); *H01L 43/12* (2013.01); *H01L 43/10* (2013.01)

(58) Field of Classification Search
CPC ......... H01L 43/02; H01L 43/10; H01L 43/12; H01L 27/222; G11C 11/161
USPC .......... 257/421, E27.005, E43.004, E21.665; 148/108; 360/324.1, 324.11, 324.12, 360/324.2; 365/158, 171, 173; 428/811.1, 811.2

See application file for complete search history.

(56) References Cited

U.S. PATENT DOCUMENTS

| | | | |
|---|---|---|---|
| 7,190,558 B2 | 3/2007 | Iwasaki et al. | |
| 7,486,551 B1 * | 2/2009 | Li | G11C 11/1675 365/158 |
| 7,985,994 B2 * | 7/2011 | Zheng | G11C 11/16 257/295 |
| 8,852,760 B2 | 10/2014 | Wang et al. | |

(Continued)

OTHER PUBLICATIONS

Rantschler at al., "Effect of 3d, 4d, and 5d transition metal doping on damping in permalloy thin films", Journal of Applied Physic 101, 033911 (2007); https://doi.org/10.1063/1.2436471, Published Online: Feb. 14, 2007, Accepted: Dec. 2006, pp. 033911-1 through 033911-5.

(Continued)

*Primary Examiner* — Dao H Nguyen
(74) *Attorney, Agent, or Firm* — Scully, Scott, Murphy & Presser, P.C.; Daniel P. Morris, Esq.

(57) ABSTRACT

A multilayered magnetic free layer structure is provided that includes a first magnetic free layer and a second magnetic free layer separated by a non-magnetic layer in which the second magnetic free layer has higher magnetic damping (greater than 0.01) as compared with the first magnetic free layer. Such a multilayered magnetic free layer structure substantially reduces the switching current needed to reorient the magnetization of the magnetic free layers. The higher magnetic damping value of the second magnetic free layer as compared to the first magnetic free layer improves the switching speed of the magnetic free layers and thus reduces, and even eliminates, write errors.

25 Claims, 4 Drawing Sheets

(56) References Cited

U.S. PATENT DOCUMENTS

| | | | |
|---|---|---|---|
| 9,978,935 B2 | 5/2018 | Hu | |
| 2005/0259463 A1* | 11/2005 | Lim | B82Y 25/00 |
| | | | 365/158 |
| 2007/0086121 A1* | 4/2007 | Nagase | B82Y 25/00 |
| | | | 360/324.1 |
| 2008/0186638 A1 | 8/2008 | Nishimura et al. | |
| 2013/0108889 A1* | 5/2013 | Piramanayagam | G11B 5/3909 |
| | | | 428/811.2 |
| 2013/0222949 A1* | 8/2013 | Braganca | G01R 33/093 |
| | | | 360/324.11 |
| 2014/0159175 A1* | 6/2014 | Lee | G11C 11/16 |
| | | | 257/421 |
| 2016/0171135 A1* | 6/2016 | Datta | G11C 11/161 |
| | | | 716/136 |
| 2017/0294575 A1 | 10/2017 | Hu et al. | |
| 2019/0074041 A1* | 3/2019 | Jung | G11C 11/161 |

OTHER PUBLICATIONS

Sun, J.Z., et al., "Spin-current interaction with a monodomain magnetic body: A model study", Physical Review B, Jul. 1, 2000, pp. 570-578, vol. 62, No. 1.

Cuchet, L. et al., "Perpendicular magnetic tunnel junctions with a synthetic storage or reference layer: A new route towards Pt- and Pd-free junctions", Scientific Reports, Published Feb. 17, 2016, vol. 6, Article No. 21246 https://www.nature.com/articles/srep21246.

\* cited by examiner (Not of the Invention)

(Of the Invention)

(Of the Invention)

MULTILAYERED MAGNETIC FREE LAYER STRUCTURE FOR SPIN-TRANSFER TORQUE (STT) MRAM

BACKGROUND

The present application relates to magnetoresistive random access memory (MRAM). More particularly, the present application relates to a magnetic tunnel junction (MTJ) structure including a multilayered magnetic free layer structure that can improve the performance of spin-transfer torque (STT) MRAM.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates (i.e., the magnetic reference or pinned layer) is a permanent magnetic set to a particular polarity; the other plate's (i.e., the magnetic free layer's) magnetization can be changed to match that of an external field to store memory. Such elements may be referred to as a magnetic tunnel junction (MTJ) structure.

One type of MRAM that can use such a MTJ structure is STT MRAM. STT MRAM has the advantages of lower power consumption and better scalability over conventional magnetoresistive random access memory which uses magnetic fields to flip the active elements. In STT MRAM, spin-transfer torque is used to flip (switch) the orientation of the magnetic free layer. Moreover, spin-transfer torque technology has the potential to make possible MRAM devices combining low current requirements and reduced cost; however, the amount of current needed to reorient (i.e., switch) the magnetization is at present too high for most commercial applications.

In the prior art of spin torque switching, the emphasis has been on lowering the magnetic damping (also called Gilbert damping) of the magnetic free layer. The theory suggests that the switching current is directly proportional to the damping; see, for example, J. Z. Sun, Phys. Rev. B 62, 570 (2000). Hence lower damping makes the free layer switch in lower current, which is desirable since it means a smaller cell transistor can be used.

FIG. 1 illustrates a prior art MTJ structure that has been developed in order to reduce the current needed to reorient (i.e., switch) the magnetization of the active elements. The prior art MTJ structure includes a multilayered magnetic free layer structure 15 that contains two magnetic free layers (14 and 18) separated by a non-magnetic layer 16 as is shown in FIG. 1. FIG. 1 also includes a magnetic reference (or pinned) layer 10, and a tunnel barrier layer 12. Element 14 is the first magnetic free layer that forms an interface with the tunnel barrier layer 12, while element 18 is the second magnetic free layer that is separated from the first magnetic free layer 14 by the non-magnetic layer 16. In the drawing, the arrow within the magnetic reference layer 10 shows a possible orientation of that layer and the doubled headed arrows in the first and second magnetic free layers (14 and 18) illustrate that the orientation in those layers can be switched. The non-magnetic layer 16 is thin enough that the two magnetic free layers (14 and 18) are coupled together magnetically, so that in equilibrium the first and second magnetic free layers 14 and 18 are always parallel.

One drawback of the prior art MTJ structure shown in FIG. 1 is that the switching of the multilayered magnetic free layer structure 15 can be too slow in comparison to the length of the applied voltage pulse. This 'drag' in switching of the orientation of the multilayered magnetic free layer structure 15 of the prior art MTJ structure of FIG. 1 may result in a write error.

There is thus a need for providing MTJ structures for use in STT MRAM technology which include an improved multilayered magnetic free layer structure that substantially reduces the switching current needed to reorient the magnetization of the multilayered magnetic free layer, while improving the switching speed and even reducing write errors of the STT MRAM.

SUMMARY

A multilayered magnetic free layer structure is provided that includes a first magnetic free layer and a second magnetic free layer separated by a non-magnetic layer in which the second magnetic free layer has higher magnetic damping (greater than 0.01) as compared with the first magnetic free layer. The multilayered magnetic free layer structure of the present application substantially reduces the switching current needed to reorient the magnetization of the two magnetic free layers. The higher magnetic damping value of the second magnetic free layer as compared to the first magnetic free layer improves the switching speed of the second magnetic free layer and thus reduces, and even eliminates, write errors.

The higher damping can be provided by a heavy metal that is inserted into, or on, a second magnetic free material. Increased damping is observed with increased atomic number of the heavy metal used in the second magnetic free layer of the multilayered magnetic free layer structure of the present application. The term "heavy metal" denotes a metal having an atomic number of equal to, or greater than 42; the heavy metal is non-magnetic. The heavy metal may be in the form of a discrete metal layer embedded in the second magnetic free layer, or the heavy metal may be in the form of a dopant or alloying element that is incorporated in the second magnetic free layer, or the heavy metal may be a cap that is located at a top of the second magnetic free layer. Another embodiment includes a second magnetic free layer that includes a multilayered structure including alternating layers of a second magnetic free material and a heavy metal.

In one aspect of the present application, a magnetic tunnel junction (MTJ) structure is provided. In one embodiment, the MTJ structure includes a multilayered magnetic free layer structure including a first magnetic free layer having a first magnetic damping value and a second magnetic free layer having a second magnetic damping value separated by a non-magnetic layer. In accordance with the present application, the second magnetic damping value is greater than the first magnetic damping value and is 0.01 or greater.

In another aspect of the present application, a spin-transfer torque magnetic random access memory (STT MRAM) is provided. In one embodiment, the STT MRAM includes a magnetic tunnel junction structure including a multilayered magnetic free layer structure of a first magnetic free layer having a first magnetic damping value and a second magnetic free layer having a second magnetic damping value separated by a non-magnetic layer, the second magnetic damping value is greater than the first magnetic damping value and is 0.01 or greater.

In yet another aspect of the present application, a method of improving the performance of a spin-transfer torque magnetic random access memory (STT MRAM) is provided. In one embodiment, the method providing a multilayered magnetic free layer structure on a surface of a tunnel barrier that is located on a magnetic reference layer. The multilayered magnetic free layer structure includes a first magnetic free layer having a first magnetic damping value and a second magnetic free layer having a second magnetic damping value separated by a non-magnetic layer, wherein the second magnetic damping value is greater than the first magnetic damping value and is 0.01 or greater.

DETAILED DESCRIPTION

Figure 1:
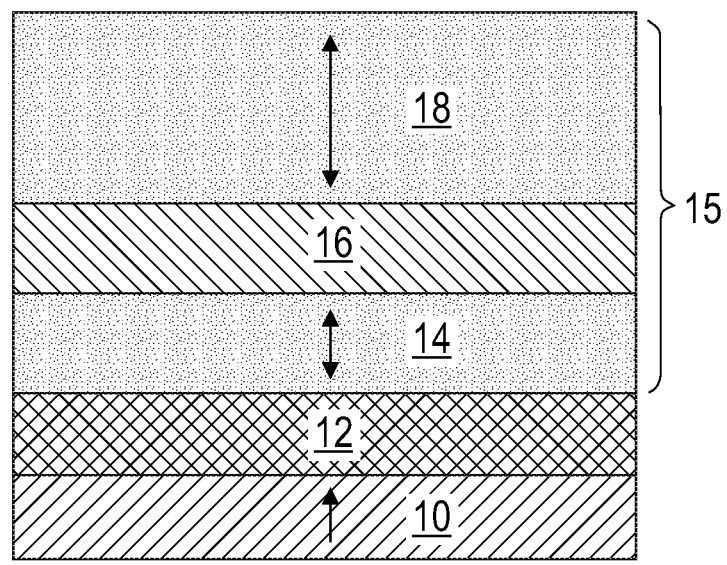
FIG. 1 is a cross sectional view of a prior art MTJ structure including a multilayered magnetic free layer structure which includes two magnetic free layers separated by a non-magnetic layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides magnetic tunnel junction (MTJ) structures, such as shown, for example, in FIGS. 2, 3, 4 and 5, that can provide improved performance to a STT MRAM. Notably, each of the inventive MTJ structures includes a multilayered magnetic free layer structure 25 that is provided on a surface of a tunnel barrier 22. The multilayered magnetic free layer structure 25 of the present application is designed to have low damping for low switching current, but also high damping for fast and hence reliable switching. Notably, this is achieved by providing a multilayered magnetic free layer structure 25 that includes a first magnetic free layer 24 and a second magnetic free layer 28 in which the second magnetic free layer 28 has higher magnetic damping (greater than 0.01) as compared with the first magnetic free layer 24 (the magnetic damping value in the first magnetic free layer 24 is 0.01 or less); a non-magnetic layer 26 is located between the first magnetic free layer 24 and the second magnetic free layer 28. In MTJ structures of present application, the first magnetic free layer 24 forms an interface with the tunnel barrier layer 22. In one embodiment, the first magnetic free layer 24 has a magnetic damping value of from 0.0005 to 0.01, while the second magnetic free layer 28 has a magnetic damping value of 0.01 to 0.5.

As stated above and due to the presence of the heavy metal in the second magnetic free layer 28, the multilayered magnetic free layer structure 25 of the present application substantially reduces the switching current needed to reorient the magnetization of the magnetic free layers (24, 28). The higher magnetic damping value of the second magnetic free layer 28 as compared to the first magnetic free layer 24 improves the switching speed of the magnetic free layers and thus reduces, and even eliminates, write errors. Increased switching speed of the magnetic free layer 25 can be improved by utilizing heavy metals with an increased atomic number.

In the present application, higher damping is provided by a heavy metal (atomic number of equal to, or greater than 42) that is inserted into, or on, the second magnetic free layer 28. The heavy metal is non-magnetic and may include a noble metal, a refractory metal, a rare earth metal or alloys thereof. Examples of heavy metals that can be employed in the present application include, but are not limited to, Ru, Rh, Pd, Hf, W, Re, Os, Jr, Pt, La, Sm, Gd, Tb, Ce, Pr, Nd, Eu, Dy, Ho, Yb or Er.

Figure 2:
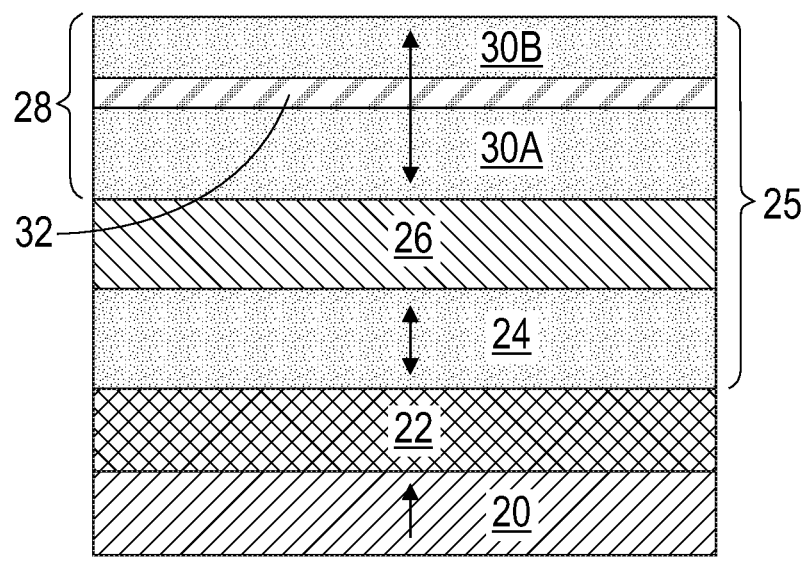
FIG. 2 is a cross sectional view of an exemplary MTJ structure in accordance with one embodiment of the present application.
Figure 3:
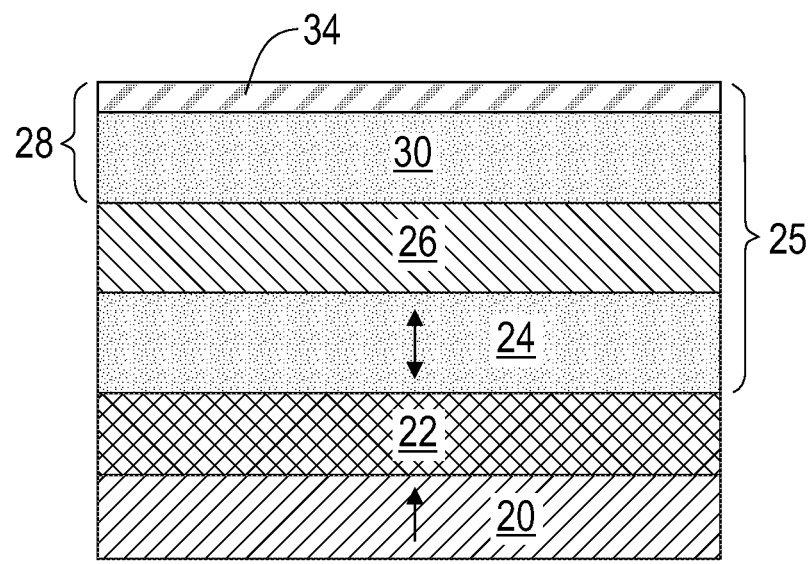
FIG. 3 is a cross sectional view of an exemplary MTJ structure in accordance with another embodiment of the present application.
Figure 4:
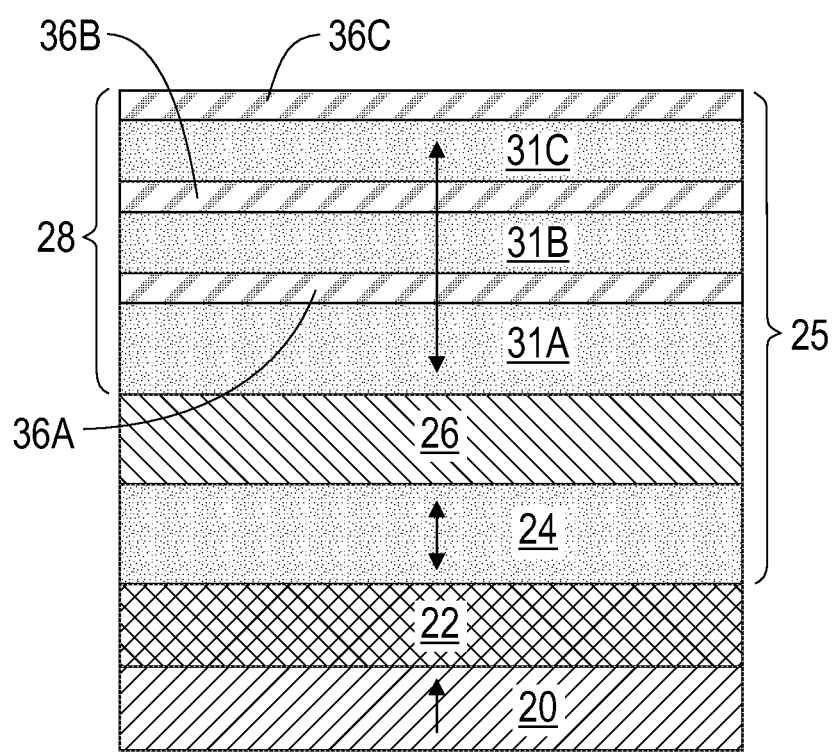
FIG. 4 is a cross sectional view of an exemplary MTJ structure in accordance with yet another embodiment of the present application.

The heavy metal may be in the form a discrete metal layer 32 which is embedded within the second magnetic free layer 28, as is shown in FIG. 2, or the heavy metal may be in the form of a dopant or alloying element that is incorporated into the second magnetic free layer (See, FIG. 5 in which reference numeral 44 denotes a heavy metal doped or alloyed magnetic free material), or the heavy metal may be a cap 34, as shown in FIG. 3, that is located on a surface of a second magnetic free material 30. Another embodiment includes a second magnetic free layer 28 that includes a multilayered structure, as shown in FIG. 4, that includes alternating layers of a second magnetic free material (31A, 31B, 31C, etc.) and a heavy metal (36A, 36B, 36C, etc.). Each of the various embodiments will now be described in greater detail. In some embodiments, the MTJ structures shown in FIGS. 2, 3, 4 and 5 may be formed be sequential deposition of a magnetic reference layer 20, a tunnel barrier 22, and a multilayered magnetic free layer structure 25. In another embodiment, the MTJ structure shown in FIGS. 2, 3, 4 and 5 can be formed by the sequential deposition of a multilayered magnetic free layer structure 25, a tunnel barrier 22, and a magnetic reference layer 20. In either embodiment, the first magnetic free layer 24 forms an interface with the tunnel barrier 22.

Referring first to FIG. 2, there is illustrated an exemplary MTJ structure in accordance with one embodiment of the present application. The MTJ structure of FIG. 2 includes a magnetic reference layer 20, a tunnel barrier 22, and a multilayered magnetic free layer structure 25 that includes a first magnetic free layer 24, a non-magnetic layer 26, and a second magnetic free layer 28. The second magnetic free layer 28 of this embodiment includes a discrete heavy metal layer 32 embedded therein. The discrete heavy metal layer 32 is located between a first portion 30A and a second portion 30B of a second magnetic free material. Although FIG. 2 illustrates a single discrete heavy metal layer 32 embedded in the second magnetic free layer 28, the present application contemplates embodiments in which more than one discrete heavy metal layer 32 is embedded in the second magnetic free layer 28. In such an embodiment, each discrete heavy metal layer separates neighboring portions of the second magnetic free material.

The magnetic reference layer 20 has a fixed magnetization and it is typically formed upon a conductive landing pad (not shown). The magnetic reference layer 20 may be composed of a metal or metal alloy that includes one or more metals exhibiting high spin polarization. In alternative embodiments, exemplary metals for the formation of magnetic reference layer 10 include iron, nickel, cobalt, chromium, boron, and manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The thickness of magnetic reference layer 20 will depend on the material selected. In one example, magnetic reference layer 20 may have a thickness from 0.3 nm to 3 nm. The magnetic reference layer 20 can be formed by utilizing a deposition process such as, for example, chemical vapor deposition (CVD), plasma enhanced chemical vapor deposition (PECVD), physical vapor deposition (PVD), or sputtering.

Tunnel barrier layer 22, which is formed above the magnetic reference layer 20, is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators. The thickness of the tunnel barrier layer 22 will depend on the material selected. In one example, the tunnel barrier layer 12 may have a thickness from 0.5 nm to 1.5 nm. The tunnel barrier layer 22 can be formed by utilizing a deposition process such as, for example, CVD, PECVD, PVD, or sputtering.

The first magnetic free layer 24 of the multilayered magnetic free layer structure 25 of the present application, which is formed on the tunnel barrier layer 22, is composed of a magnetic material (i.e., a first magnetic material) with a magnetization that can be changed in orientation relative to the magnetization orientation of the magnetic reference layer 20. Exemplary materials for the first magnetic free layer 24 include alloys and/or multilayers of cobalt, iron, alloys of cobalt-iron, nickel, alloys of nickel-iron, and alloys of cobalt-iron-boron. The first magnetic free layer 24 may have a thickness from 0.3 nm to 3 nm. The first magnetic free layer 24 can be formed by utilizing a deposition process such as, for example, CVD, PECVD, PVD, or sputtering.

The non-magnetic layer 26 of the multilayered magnetic free layer structure 25 is composed of a non-magnetic material that contains at least one element with an atomic number less than 74 such as, for example, Be, Mg, Al, Ca, B, C, Si, V, Cr, Ti, Mn or any combination including alloys thereof. The thickness of the non-magnetic layer 26 is thin enough to allow the first and second magnetic free layers (24, 28) to couple together magnetically so that in equilibrium layers 14 and 18 are always parallel. In one example, the non-magnetic layer 26 has a thickness from 0.3 nm to 3.0 nm. The non-magnetic layer 26 can be formed by utilizing a deposition process such as, for example, CVD, PECVD, PVD, or sputtering.

The second magnetic free layer 28 of the multilayered magnetic free layer structure 25 is formed on the nonmagnetic material layer 26. In the illustrated embodiment, a first portion 30A of a second magnetic free material is formed first, followed by the formation of the discrete heavy metal layer 32, and thereafter the second portion 30B of the second magnetic free material. The steps of formation of a discrete heavy metal layer and formation of a portion of the second magnetic free material may repeated any number of times.

Each portion (i.e., 30A, 30B, etc.) of the second magnetic free material may include one of the magnetic materials mentioned above for the first magnetic free material that provides the first magnetic free layer 24. In some embodiments, each portion (i.e., 30A, 30B, etc.) of the second magnetic free material may be the same as the first magnetic free material that provides the first magnetic free layer 24. In other embodiments, each portion (i.e., 30A, 30B, etc.) of the second magnetic free material may be different from the first magnetic free material that provides the first magnetic free layer 24. Within the second magnetic free layer 28, each portion (30A, 30B, etc.) of second magnetic free material may be a same or different magnetic free material. Each portion (i.e., 30A, 30B, etc.) of the second magnetic free material may have a thickness from 0.3 nm to 3 nm. Each portion (i.e., 30A, 30B, etc.) of the second magnetic free material can be formed by utilizing a deposition process such as, for example, CVD, PECVD, PVD, or sputtering.

Each discrete heavy metal layer 32 that is formed is composed of a heavy metal having an atomic number of equal to, or greater than 42. In some embodiments, the heavy metal that is used in providing each discrete heavy metal layer 32 has an atomic number of equal to, or greater than 74. The heavy metal may include a noble metal, a refractory metal, a rare earth metal or alloys thereof. Examples of heavy metals that can be employed in the present application as each discrete heavy metal layer 32 include, but are not limited to, Ru, Rh, Pd, Hf, W, Re, Os, Ir, Pt, La, Sm, Gd, Tb, Ce, Pr, Nd, Eu, Dy, Ho, Yb or Er. Each discrete heavy metal layer 32 has a thickness from 0.1 nm to 2 nm. This layer must be thin enough that layers 30A and 30B are strongly magnetically coupled together Each discrete heavy metal layer 32 can be formed by utilizing a deposition process such as, for example, CVD, PECVD, PVD, or sputtering.

Referring now to FIG. 3, there illustrated another exemplary MTJ structure in accordance with another embodiment of the present application. The MTJ structure of FIG. 3 includes a magnetic reference layer 20 (as defined above), a tunnel barrier 22 (as defined above), and a multilayered magnetic free layer structure 25 that includes a first magnetic free layer 24, as defined above, a non-magnetic layer 26, as defined above, and a second magnetic free layer 28. In this embodiment, the second magnetic free layer 28 includes a heavy metal cap 34 located at a top surface thereof.

Notably, and in this embodiment of the present application, the heavy metal cap 34 is located on a surface of a second magnetic free material 30. The second magnetic free material 30 of the second magnetic free layer 28 of this embodiment of the present application includes one of the magnetic free materials mentioned above for the first magnetic free layer 26. In some embodiments, the second magnetic free material 30 may be composed of a same magnetic free material as the first magnetic free material that provides the first magnetic free layer 24. In other embodiments, the second magnetic free material 30 may be composed of a different magnetic free material than the first magnetic free material that provides the first magnetic free layer 24. The second magnetic free material 30 may be formed utilizing one of the deposition process mentioned above in providing the first magnetic free layer 26. The second magnetic free material 30 may have a thickness from 0.3 nm to 3.0 nm.

The heavy metal cap 34 that is formed is composed of a heavy metal having an atomic number of equal to, or greater than 42. In some embodiments, the heavy metal that is used in providing the heavy metal cap 34 has an atomic number of equal to, or greater than 74. The heavy metal may include a noble metal, a refractory metal, a rare earth metal or alloys thereof. Examples of heavy metals that can be employed in the present application as the heavy metal cap 34 include, but are not limited to, Ru, Rh, Pd, Hf, W, Re, Os, Ir, Pt, La, Sm, Gd, Tb, Ce, Pr, Nd, Eu, Dy, Ho, Yb or Er. The heavy metal layer 34 has a thickness to provide increased damping. In one example, the heavy metal layer 34 has a thickness from 0.1 nm to 2 nm. The heavy metal layer 34 can be formed by utilizing a deposition process such as, for example, CVD, PECVD, PVD, or sputtering.

Referring now to FIG. 4, there illustrated another exemplary MTJ structure in accordance with yet other embodiment of the present application. The MTJ structure of FIG. 4 includes a magnetic reference layer 20 (as defined above), a tunnel barrier 22 (as defined above), and a multilayered magnetic free layer structure 25 that includes a first magnetic free layer 24, as defined above, a non-magnetic layer 26, as defined above, and a second magnetic free layer 28. In this embodiment, the second magnetic free layer 28 includes a multilayered structure that includes alternating layers of a second magnetic free material (31A, 31B, 31C, etc.) and a heavy metal (36A, 36B, 36C, etc.).

In the illustrated embodiment of FIG. 4, a layer of a second magnetic free material is formed first, followed by the formation of a layer of a heavy metal, and these steps of formation of a layer of the second magnetic free material and a layer of heavy metal may repeated any number of times.

Each layer (i.e., 31A, 31B, 31C, etc.) of the second magnetic free material may include one of the magnetic materials mentioned above for the first magnetic free material that provides the first magnetic free layer 24. In some embodiments, the second magnetic free material that provides each layer (i.e., 31A, 31B, 31C, etc.) of the second magnetic free material may same as the first magnetic free material that provides the first magnetic free layer 24. In other embodiments, the second magnetic free material that provides each layer (i.e., 31A, 31B, 31C, etc.) of the second magnetic free material may be different from the first magnetic free material that provides the first magnetic free layer 24. Each layer (i.e., 31A, 31B, 31C, etc.) of the second magnetic free material may have a thickness from 0.3 nm to 3 nm. Each layer (i.e., 31A, 31B, 31C, etc.) of the second magnetic free material can be formed by utilizing a deposition process such as, for example, CVD, PECVD, PVD, or sputtering.

Each layer of heavy metal (36A, 36B, 36C, etc.) that is formed is composed of a heavy metal having an atomic number of equal to, or greater than 42. In some embodiments, the heavy metal that is used in providing each layer of heavy metal (36A, 36B, 36C, etc.) has an atomic number of equal to, or greater than 74. The heavy metal may include a noble metal, a refractory metal, a rare earth metal or alloys thereof. Examples of heavy metals that can be employed in the present application as each layer of heavy metal layer (36A, 36B, 36C, etc.) include, but are not limited to, Ru, Rh, Pd, Hf, W, Re, Os, Jr, Pt, La, Sm, Gd, Tb, Ce, Pr, Nd, Eu, Dy, Ho, Yb or Er. Each layer of heavy metal (36A, 36B, 36C, etc.) must be thin enough to maintain coupling. In one example, each layer of heavy metal (26A, 36B, 36C) has a thickness from 0.1 nm to 2 nm. Each layer of heavy metal (36A, 36B, 36C, etc.) can be formed by utilizing a deposition process such as, for example, CVD, PECVD, PVD, or sputtering.

Figure 5:
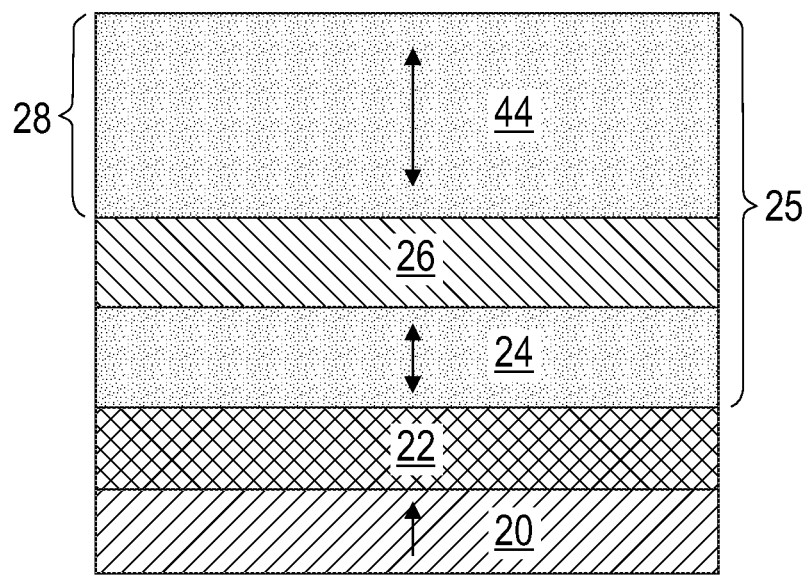
FIG. 5 is a cross sectional view of an exemplary MTJ structure in accordance with a further embodiment of the present application.

Referring now to FIG. 5, there illustrated an exemplary MTJ structure in accordance with a further embodiment of the present application. The MTJ structure of FIG. 4 includes a magnetic reference layer 20 (as defined above), a tunnel barrier 22 (as defined above), and a multilayered magnetic free layer structure 25 that includes a first magnetic free layer 24, as defined above, a non-magnetic layer 26, as defined above, and a second magnetic free layer 28. In this embodiment, the second magnetic free layer 28 is a heavy metal doped or alloyed second magnetic free material 44. The doping or alloying does not need to be uniform within layer 28. The doping or alloy concentration could change as a function of the vertical dimension.

The heavy metal doped or alloyed second magnetic free material 44 includes a second magnetic free material, which may be the same or different from the magnetic free material of the first magnetic free layer 24, and at least one heavy metal as the dopant or alloying material. The at least one heavy metal dopant has an atomic number of equal to, or greater than 42. In some embodiments, the at least one heavy metal dopant or alloying element has an atomic number of equal to, or greater than 74. The at least one heavy metal dopant or alloying element may include a noble metal, a refractory metal, or a rare earth metal. Examples of heavy metal dopants or alloying elements that can be employed in the present application include, but are not limited to, Ru, Rh, Pd, Hf, W, Re, Os, Jr, Pt, La, Sm, Gd, Tb, Ce, Pr, Nd, Eu, Dy, Ho, Yb or Er. In accordance with the present application, the at least one heavy metal dopant or alloying element is present in second magnetic free material in a concentration from 10E20 atoms/cm$^3$ to 2×10E22 atoms/cm$^3$ or in the range 0.1-20%. In one embodiment of the present application, the heavy metal doped second magnetic free material 44 has a uniform dopant or alloying element concentration. In another embodiment, the heavy metal doped second magnetic free material 44 has a non-uniform dopant or alloying element concentration, which may include regions of non-doped second magnetic free material. It yet other embodiments, the heavy metal doped second magnetic free material 44 has a graded dopant concentration of the at least one heavy metal ion present therein.

The heavy metal doped second magnetic free material 44 can be formed by depositing a non-doped second magnetic free material utilizing one of CVD, PECVD, PVD, or sputtering. The heavy metal dopant or alloying element that can be incorporated into the non-doped second magnetic free material utilizing ion implantation, gas phase doping or dopant diffusion from an sacrificial dopant containing material.

Due to the presence of the heavy metal in the second magnetic free layer 28 of the MTJ structures shown in FIGS. 2, 3, 4 and 5, the multilayered magnetic free layer structure 25 of the present application substantially reduces the switching current needed to reorient the magnetization of the magnetic free layers (24, 28). The higher magnetic damping value of the second magnetic free layer 28 as compared to the first magnetic free layer 24 improves the switching speed of the magnetic free layers and thus reduces, and even eliminates, write errors.

Figure 6:
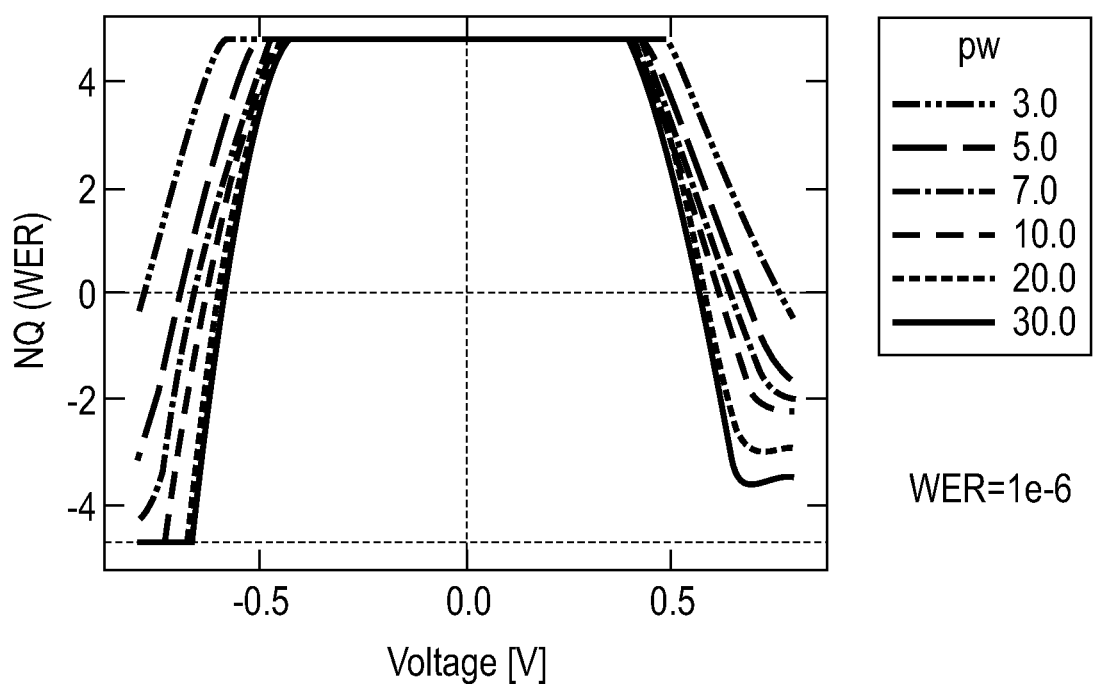
FIG. 6 is a graph illustrating the write error rate of a prior art MTJ structure; the y-axis is in normal quantile scale, and pw stands for the pulse width in nanosecond units.

As mentioned above, and in prior art of spin torque switching, the emphasis has been on lowering the magnetic damping of the magnetic free layer. However, this does not take into account the reliability of switching time correctly. In the present application the reliability of switching can be measured by 'write error rate'. The write error rate is the probability that the bit does not switch when you apply a current pulse. A write error rate of less than 1e-6 is typically needed, though the exact value required varies from application to application in the range 1e-20 to 1e-4. In some prior art free magnetic layers, the write error rate flattens at values greater than 1e-6 (See, FIG. 6), so that even at high voltage the magnetic free layer does not write reliably.

Figure 7:
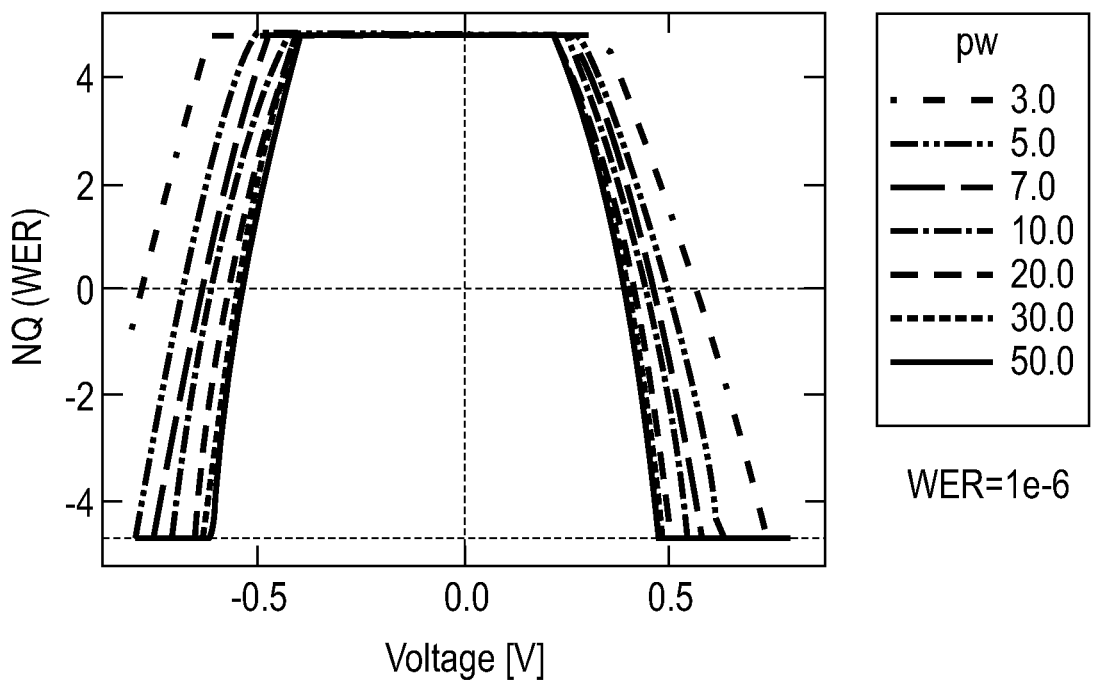
FIG. 7 is a graph illustrating the write error rate of a MTJ structure of the present application; the y-axis is in normal quantile scale, and pw stands for the pulse width in nanosecond units.
Figure 8:
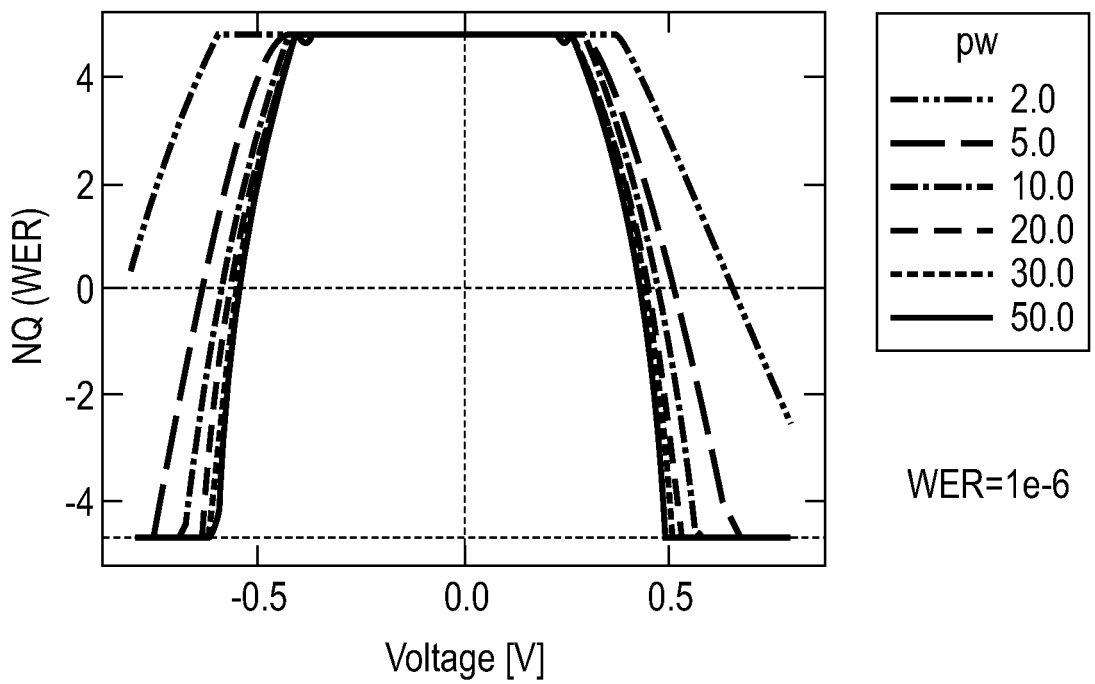
FIG. 8 is a graph illustrating the write error rate of another MTJ structure of the present application; the y-axis is in normal quantile scale, and pw stands for the pulse width in nanosecond units.

The above problem is fixed in the present application by utilizing an MTJ structure that includes the multilayered magnetic free layer structure of the present application and excellent write error rate is observed (See, FIGS. 7 and 8). In FIGS. 7-8, a heavy metal (Jr for the data shown in FIG. 7 and Tb for the data shown in FIG. 8) was added to the second magnetic free layer. In both cases the write error rate does not flatten but continues to drop as the voltage is increased. The reason this works is that the switching speed of a magnetic layer is inversely proportional to the magnetic damping.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction structure comprising:
a multilayered magnetic free layer structure comprising a first magnetic free layer having a first magnetic damping value and a second magnetic free layer having a second magnetic damping value separated by a non-magnetic layer, wherein the second magnetic damping value is greater than the first magnetic damping value and is 0.01 or greater and the first magnetic free layer and the second magnetic free layer are coupled together magnetically so that in equilibrium the first and second magnetic free layers have magnetizations that are parallel to each other.

2. The magnetic tunnel junction structure of claim 1, wherein the second magnetic damping value is provided by at least one discrete heavy metal layer embedded in the second magnetic free layer.

3. The magnetic tunnel junction structure of claim 2, wherein the at least one discrete heavy metal layer comprises a noble metal, a refractory metal, a rare earth metal or alloys thereof.

4. The magnetic tunnel junction structure of claim 2, wherein the at least one discrete heavy metal layer has a thickness from 0.1 nm to 2 nm.

5. The magnetic tunnel junction structure of claim 2, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

6. The magnetic tunnel junction structure of claim 1, wherein the second magnetic damping value is provided by a discrete heavy metal cap located at a top of the second magnetic free layer.

7. The magnetic tunnel junction structure of claim 6, wherein the at least one discrete heavy metal cap comprises a noble metal, a refractory metal, a rare earth metal or alloys thereof.

8. The magnetic tunnel junction structure of claim 6, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

9. The magnetic tunnel junction structure of claim 1, wherein the second magnetic damping value is provided by at least one heavy metal dopant or alloying element that is incorporated into the second magnetic free layer.

10. The magnetic tunnel junction structure of claim 9, wherein the at least one heavy metal dopant comprises a noble metal, a refractory metal, or a rare earth metal.

11. The magnetic tunnel junction structure of claim 9, wherein the at least one heavy metal dopant or alloying element is present in the second magnetic free layer in a concentration from 0.1% to 20%.

12. The magnetic tunnel junction structure of claim 9, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

13. A spin-transfer torque magnetic random access memory comprising:
a magnetic tunnel junction structure comprising a multi-layered magnetic free layer structure of a first magnetic free layer having a first magnetic damping value and a second magnetic free layer having a second magnetic damping value separated by a non-magnetic layer, the second magnetic damping value is greater than the first magnetic damping value and is 0.01 or greater, and the first magnetic free layer and the second magnetic free layer are coupled together magnetically so that in equilibrium the first and second magnetic free layers have magnetizations that are parallel to each other.

14. The spin-transfer torque magnetic random access memory of claim 13, wherein the second magnetic damping value is provided by at least one discrete heavy metal layer embedded in the second magnetic free layer.

15. The spin-transfer torque magnetic random access memory of claim 14, wherein the at least one discrete heavy metal layer comprises a noble metal, a refractory metal, a rare earth metal or alloys thereof.

16. The spin-transfer torque magnetic random access memory of claim 14, wherein the at least one discrete heavy metal layer has a thickness from 0.1 nm to 2 nm.

17. The spin-transfer torque magnetic random access memory of claim 14, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

18. The spin-transfer torque magnetic random access memory of claim 13, wherein the second magnetic damping value is provided by a discrete heavy metal cap located at a top of the second magnetic free layer.

19. The spin-transfer torque magnetic random access memory of claim 18, wherein the at least one discrete heavy metal layer comprises a noble metal, a refractory metal, a rare earth metal or alloys thereof.

20. The spin-transfer torque magnetic random access memory of claim 18, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

21. The spin-transfer torque magnetic random access memory of claim of 13, wherein the second magnetic damping value is provided by at least one heavy metal dopant or alloying element incorporated into the second magnetic free layer.

22. The spin-transfer torque magnetic random access memory of claim 21, wherein the at least one heavy metal dopant or alloying element comprises a noble metal, a refractory metal, or a rare earth metal.

23. The spin-transfer torque magnetic random access memory of claim 21, wherein the at least one heavy metal dopant or alloying element is present in the second magnetic free layer in a concentration from 0.1% to 20%.

24. The spin-transfer torque magnetic random access memory of claim 21, further comprising a tunnel barrier layer located on a surface of the first magnetic free layer opposite a surface of the first magnetic free layer that forms an interface with the non-magnetic layer, and a magnetic reference layer located on a surface of the tunnel barrier layer that is opposite the surface of the tunnel barrier that forms an interface with the first magnetic free layer.

25. A method of improving the performance of spin-transfer torque magnetic random access memory, the method comprising:
   providing a multilayered magnetic free layer structure on a surface of a tunnel barrier that is located on a magnetic reference layer, wherein the multilayered magnetic free layer structure comprises a first magnetic free layer having a first magnetic damping value and a second magnetic free layer having a second magnetic damping value separated by a non-magnetic layer, wherein the second magnetic damping value is greater than the first magnetic damping value and is 0.01 or greater and the first magnetic free layer and the second magnetic free layer are coupled together magnetically so that in equilibrium the first and second magnetic free layers have magnetizations that are parallel to each other.

* * * * *